April 14, 1953 M. ZUCKERMAN 2,635,154
ELECTRICAL APPARATUS FOR SWITCHING ON AND OFF A NUMBER OF CIRCUITS IN ACCORDANCE WITH A PRESCRIBED CYCLE
Filed Aug. 4, 1950 2 SHEETS—SHEET 1

INVENTOR.
MILTON ZUCKERMAN
BY Joseph B. Forman
ATTORNEY.

INVENTOR.
MILTON ZUCKERMAN
BY Joseph B. Forman
ATTORNEY.

Patented Apr. 14, 1953 2,635,154

UNITED STATES PATENT OFFICE 2,635,154

ELECTRICAL APPARATUS FOR SWITCHING ON AND OFF A NUMBER OF CIRCUITS IN ACCORDANCE WITH A PRESCRIBED CYCLE

Milton Zuckerman, Brooklyn, N. Y.

Application August 4, 1950, Serial No. 177,606

5 Claims. (Cl. 200—88)

This invention relates to an improved apparatus for electrical switching and more especially to electrical apparatus which is used for switching on and off a number of circuits in accordance with a prescribed cycle.

Due to the widespread application of electrical devices, it has become desirable to provide suitable means for automatic control. In particular, the control of devices which perform a series of operations has become an important problem. For example, traffic signals must be switched on and off in a prescribed cycle; washing machines must wash for a certain time interval, rinse for another time interval and dry for still another time interval; automatic screw machines must bring a tool to the work, cut the work, remove the tool, move the work to the next cutting tool, etc. Electrical control for all these mechanisms and countless others is generally used because of its extreme flexibility.

The present invention provides an improved means for switching on and off a number of electrical circuits, and also enables the time which any one circuit is kept on or off to be adjusted. By connecting these circuits to the device which is to be controlled, it is possible to perform one operation for a given time interval and then perform succeeding operations one after the other for different time intervals. After an entire cycle has been completed, the invention automatically repeats the cycle.

In order to carry out the purposes of the invention, the armature of a solenoid is caused to undergo a motion which consists of a series of rectilinear translations with a period of time during which the armature is held at rest between each translation. Upon completion of a series of translations, the armature is automatically attracted to the solenoid and the sequence is repeated. Each time the armature moves, switch contacts are opened or closed, and these contacts may be used to control any suitable device. It is thus simple to cause a given pair of contacts to remain either open or closed for several translations of the armature; and consequently, a control circuit may be energized when desired and remain energized for any desired period of time within the complete cycle of operation.

The motion of the armature is obtained by forming a series of teeth or cams on its opposite edges, engaging a tooth for a period of time to hold the armature at rest, and then allowing the armature to translate the distance between teeth at which time the next tooth becomes engaged to hold the armature at rest for another period of time. To engage the teeth the armature passes through a slotted member which moves back and forth perpendicular to the direction of motion of the armature and engages a tooth on one side of the armature in one position and a tooth on the other side in the opposite position. Furthermore, the slot is so formed that when it moves far enough to release a tooth on one side, a tooth on the opposite side will be engaged when the armature is moved in its direction of motion. In order to achieve this action, it is necessary to form the teeth so that between two teeth on one side of the armature there is one tooth on the opposite side of the armature. Movement of the armature is due to the action of gravity in one form of the invention; and due to the action of a spring in another form of the invention.

A bi-metallic strip is fastened to one end of the slotted member and a restoring member to the other end of the slotted member in order to obtain periodic motion of the slotted member. It is well known that when a bi-metallic strip is heated, as, for example, by passing an electric current through a heater for it, the bi-metallic strip bends, and when the current ceases the strip cools and moves back to its original position. Thus, it is clear that if an electric current passes through a heater for the bi-metallic strip it will cause the slotted member to move in a prescribed direction; and if the current is then stopped the bi-metallic strip will cool and the slotted member will be returned to its initial position because of the return of the bi-metallic strip to the original position and the action of the restoring member.

Automatic heating of the bi-metallic strip is provided for by having a switch in the heating circuit which remains closed every other time the armature comes to rest. Since the armature travels the entire distance between two teeth on one side of the armature in a complete cycle of the restoring member and is held at rest by the engagement of teeth on the same side of the armature every other time the armature is held at rest, it is convenient to have each tooth on one side of the armature close the switch in the heating circuit when it comes to rest at a prescribed position. The arrangement just described will give the slotted member a periodic motion which will enable the armature to move in a series of translations.

Owing to the fact that the rate of heating and cooling of the bi-metallic strip may be different, the time which the slotted member takes to move in one direction may be different from the time taken to return to its initial position. In fact, the heating rate of the bi-metallic strip may be easily controlled by varying the current in the heating circuit. Consequently, the time the armature remains at rest may be different when a tooth on one side is engaged by the slotted member from when a tooth on the opposite side is engaged by the slotted member and may be further varied by controlling the size of the various teeth.

In order to repeat the cycle, the armature must be returned to an initial position after it has completed an entire series of translations. To accomplish this, a reset circuit which attracts the armature to the electromagnet is actuated at the end of a series of translations by a throw lever attached to the armature. Once the armature is returned to its starting position, the electromagnet is no longer energized because the reset switch is opened and the armature begins a new series of translations.

Cam members which actually open and close the control circuits are attached to the armature and undergo the same motion as it. Risers are formed on the cam members which contact followers that close the switches in the control circuits for as long as the follower is deflected. It is therefore apparent that any given control switch may remain closed for any part of the cycle of the armature by forming a riser of sufficient length. Conversely, by only pushing against the follower for a short time a specific switch may remain open for most of the armature cycle. The time when any given switch is closed is determined by the point where the riser which moves the follower of a switch is located with reference to the complete cycle of the armature. A single cam member may be used, or an entire bank of cams may be fastened one behind the other to actuate a large number of control switches. Needless to say, the control switches and circuits may be of any type and used for any appropriate purpose. Through the use of relays and other devices, for instance, large currents and heavy mechanisms may be controlled.

Instead of fastening cam members directly to the armature, a rack and pinion may be used to rotate a cylindrical drum, which has cams fastened to its curved surface. The cams may be made removable so that the control mechanisms may be adjusted for a variety of different switching arrangements.

It will be apparent that the foregoing invention has many advantages. Among these are simplicity, adaptability, ease of manufacture and dependable trouble free operation. Other further advantages, objects and purposes of the invention will become apparent from the following description and claims or will otherwise become obvious.

For a clearer understanding of the invention, specific embodiments of the invention have been illustrated in the accompanying drawing wherein.

Figure 1:
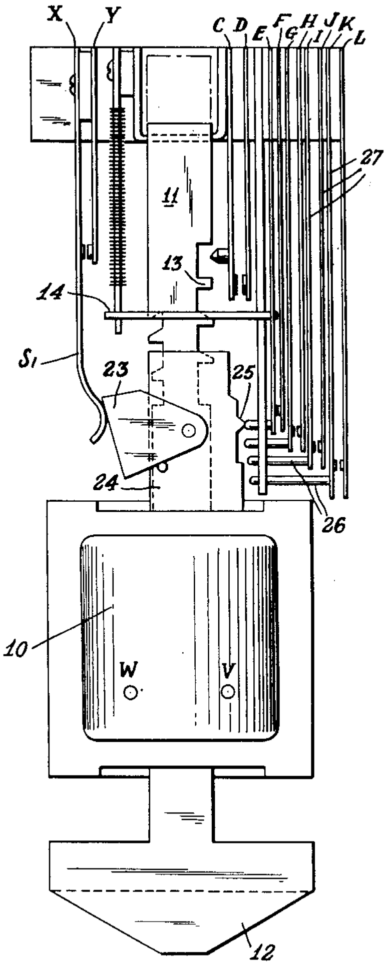
Fig. 1 is a front view of a control switch embodying the invention.
Figure 2:
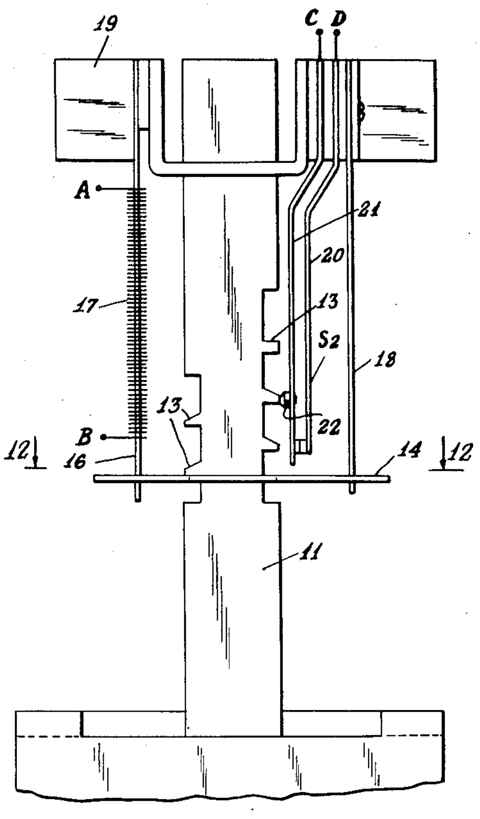
Fig. 2 is a front view of a portion of Fig. 1 showing in detail the mechanism used to cause periodic motion of the armature of Fig. 1.
Figure 10:
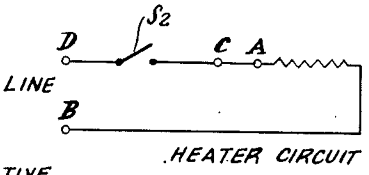
Fig. 10 is a diagram of the circuit used for heating the bi-metallic strip.

Referring specifically to Figs. 1 and 2, 10 designates the electromagnetic solenoid which attracts armature 11 to it when a voltage is applied across terminals W and V of the solenoid. Armature 11 is formed of a suitable magnetic material such as a metal and passes through solenoid 10 with weighted end 12 on one side of solenoid 10. On the other side of solenoid 10, teeth 13 are formed on the edges of armature 11. Along one edge of armature 11, teeth 13 are equidistant, and the teeth along the other edge of armature 11 are also equidistant; but are located in such manner that between each two teeth on one edge of armature 11, there is one tooth midway between them on the opposite edge of armature 11.

Figure 12:
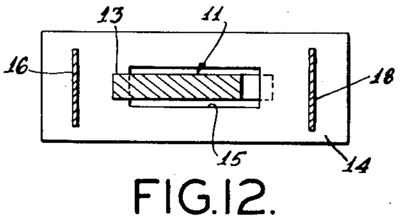
Fig. 12 is a front view of the slotted member used in the invention.

Slotted member 14, which is placed perpendicular to the longitudinal axis of armature 11, is used to engage teeth 13 and thereby hold armature 11 in a fixed position. Engagement of slotted member 14 with teeth 13 is by means of slot 15 which is formed in slotted member 14 and is illustrated in Fig. 12. Fastened to one end of slotted member 14 is bi-metallic strip 16 which passes through electrical heater element 17 which contains terminal elements A and B as shown in Fig. 2. At the other end of slotted member 14 is restoring member 18 which is made of a suitable resilient material such as a steel spring or the like. Bi-metallic strip 16 and restoring member 18 are fastened to insulating bloc 19 which is formed of any suitable insulating material having the requisite strength such as Bakelite or the like. Also attached to insulating bloc 19 are switch members 20 and 21 which are formed of any suitable resilient material that is a good conductor of electricity. On switch member 21 abutment 22 is formed which acts in conjunction with preselected teeth 13 of armature 11 as will be hereafter explained. Terminals C and D extend from switch members 20 and 21 respectively as shown in Fig. 2.

The action of all the foregoing elements in producing a periodic motion of the armature which consists of a series of translations of the armature with a period of time during which the armature is held at rest between each translation will now be explained. Teeth 13 of armature 11 and slot 15 of slotted member 14 are so proportioned that when one edge of slot 15 is engaged with a tooth on one side of armature 11 and slotted member 14 is moved perpendicular to the longitudinal axis of armature 11 so as to cause the tooth to become disengaged, armature 11 will begin to fall because of its weighted end 12, but will be stopped by the engagement of the tooth on the opposite side of armature 11 with the diametrically opposite edge of slot 15. If the direction of motion of slotted member 14 is reversed, the tooth on the opposite side of armature 11 will become disengaged and the armature will fall again due to weighted end 12 and be stopped by the engagement of a tooth 13 on the side of armature 11 which is directly above the tooth 13 that was holding armature 11 at the beginning of the cycle. From the foregoing description, it is clear that armature 11 will undergo a series of translations if slotted member 14 is moved periodically in a direction perpendicular to the longitudinal axis of armature 11.

Periodic motion of slotted member 14 is obtained by means of the heater circuit shown schematically in Fig. 10. When switch S2 is closed an electric current will pass through terminals A and B of heater 17 and cause bi-metallic strip 16 to bend. The bending of bi-metallic strip 16 moves slotted member 14 perpendicular to the longitudinal axis of armature 11 which, heretofore, as explained caused armature 11 to undergo a translation. If now $S_2$ is opened, heater element 17 will cool and bimetallic strip 16 together with slotted member 14 will be moved towards their initial positions because of the action of the bimetallic element and restoring member 18. The return movement of slotted member 14 also causes another translation of armature 11. It is clear that switch $S_2$ must be closed every other time armature 11 is at rest in order to give slotted member 14 the required periodic motion. Automatic closing of switch $S_2$ every other time armature 11 is at rest is provided for by having abutment 22 of switch $S_2$ contact every tooth 13 on one side of armature 11. Since the armature translates the distance between two teeth 13 on one of its sides in a complete cycle of slotted member 14, it is apparent that the next tooth 13 on the same side of armature 11 will come to rest in contact with abutment 22 every other time armature 11 is held at rest. Reference to Fig. 2 will make the closing cycle of switch $S_2$ clear. At the instant shown in Fig. 2 armature 11 is held through the engagement by slotted member 14 of a tooth 13 on the side of armature 11 nearest to bi-metallic strip 16; and switch $S_2$ is closed allowing bi-metallic strip 16 to be heated. After a time, bi-metallic strip 16 will bend and cause slotted member 14 to move and disengage armature 11. Armature 11 will now fall due to the gravitational effect of weighted end 13 but the engagement of a tooth 13 on the side of armature 11 nearest to $S_2$ will cause armature 11 to be held at rest. Switch $S_2$ is now open because abutment 22 lies between two teeth 13 and therefore bi-metallic strip 16 will cool. Restoring member 18 will, after a time, return slotted member 14 to its original position. As slotted member 14 is returned to its original position, armature 11 will become disengaged from the tooth 13 holding it and begin to fall. However, armature 11 will be stopped once again by the engagement of a tooth 13 on the side of armature 11 nearest bi-metallic strip 16. The situation is now the same as the one illustrated in Fig. 2 except that armature 11 has descended the distance between teeth 13 on one side of the armature 11, and the entire cycle begins to repeat itself.

Figure 9:
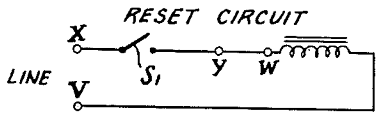
Fig. 9 is a diagram of the reset circuit used in the invention.

In addition to the series of translations of armature 11 whose operation has just been described, armature 11 must be restored to its original position after a complete series of translations. To accomplish this purpose, the reset circuit shown schematically in Fig. 9 is used. When switch $S_1$ illustrated in Figure 1 is closed by the tilting movement of throw lever 23 which is moved downward simultaneously with cam member 24 to which it is secured, electromagnetic solenoid 10 will be energized and armature 11 will be attracted to solenoid 10 so that the lowest tooth 13 will be engaged by slotted member 14. Teeth 13 are formed with inclined rear portions so that when armature 11 moves upward, slotted member 14 will automatically be moved in the correct direction to prevent the engagement of any of the teeth of armature 11. Switch $S_1$ is closed by throw lever 23 which is located so that it closes $S_1$ when armature 11 is at its lowest point. Throw lever 23 is pivotally secured to cam 24 and relaxes its tension against $S_1$ as it moves downwardly, permitting $S_1$ to close.

Figure 3:
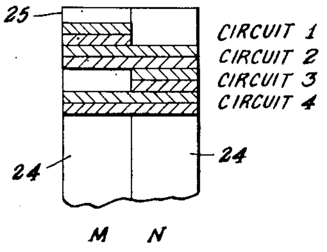
Fig. 3 is a side sectional view on alternate multiple cam member showing how the invention may be adapted to actuate a bank of control switches.

The motion of armature 11 which has just been described is utilized to perform actual switching of control circuits by attaching cam member 24 to it. One cam member 24 is shown in Fig. 1 although more than one may be used by joining them behind each other to form a bank. A typical bank consisting of two members 24 is shown in Fig. 3. Risers 25 are formed on cam member 24, and these risers 25 actuate followers 26 of control circuit switches 27. Control switches 27 are of any suitable type and may be conveniently attached to insulating block 19 as shown in Fig. 1. By forming risers 25 at a specified position along armature 11, any given circuit may be closed at a desired point in the cycle of armature 11. Likewise, by forming risers 25 of sufficient length a given circuit may be kept closed for as long a portion of the cycle of armature 11 as desired. Using two cam members 24 shown in Fig. 3, both members close control switches of circuits 2 and 4 simultaneously whereas circuits 1 and 3 are only closed by one cam member separately. Thus it is possible to close any number of control switches simultaneously by using a bank of cam members 24. While the use of cam members to close control switches has been shown, it is obvious that the cam members may be used to open control switches instead of close them.

Figure 11:
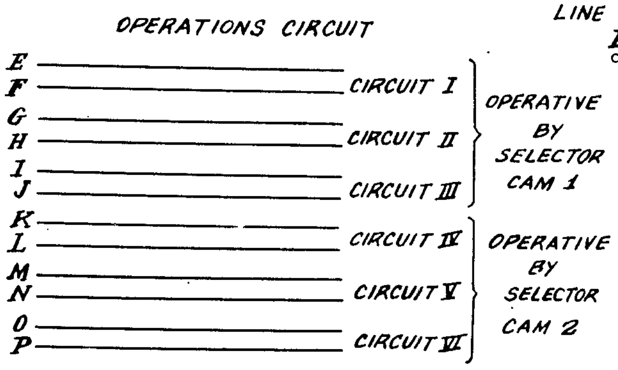
Fig. 11 is schematic of a typical operations circuit which may be obtained through use of the invention.

A typical series of operations which may be obtained by using two selector cam members 24 is shown in Fig. 11. Circuits 1 through 3 are controlled by one selector cam; whereas circuits 4 through 6 are controlled by another selector cam.

Figure 4:
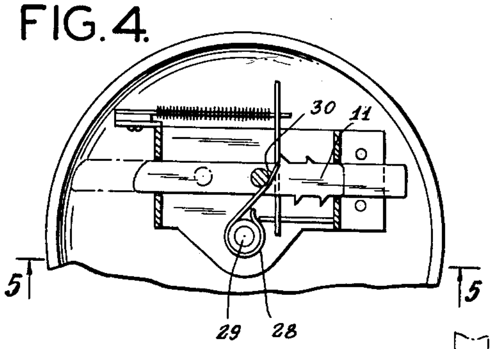
Fig. 4 is a front view of another embodiment of the invention which uses a spring to return the armature to its initial position.
Figure 5:
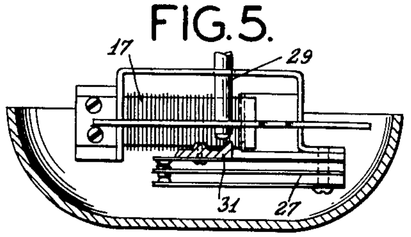
Fig. 5 is a sectional view along the line 5—5 of Fig. 4.

For many applications of the invention the use of weighted end 12 and gravity is impractical and inconvenient. The modification shown in Figs. 4 and 5 has been developed to overcome these objections. Instead of using gravity, spring 28 causes armature 11 to move when slotted member 14 is moved perpendicularly to the longitudinal axis of armature 11. Spring 28 is fastened to shaft 29 and acts against member 30 which may be a manual set hand and which projects from armature 11. Member 30 may be also used to actuate cam selector member 31 and thereby close control switches 27 of Fig. 5. In all other respects the operation of this modification of the invention is identical with the one heretofore described.

Figure 6:
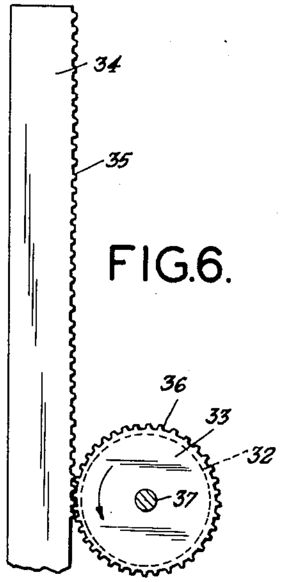
Fig. 6 is a view showing how the motion of the armature may be used to rotate a fixed circular drum.
Figure 7:
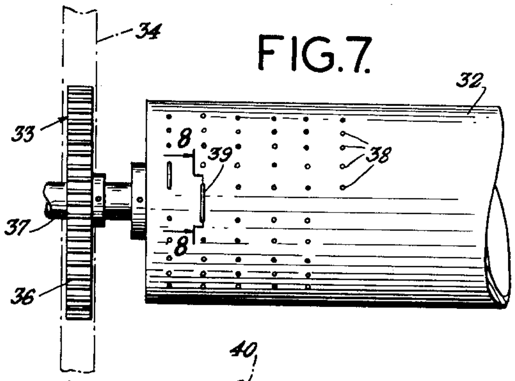
Fig. 7 is a view of the drum rotated by the mechanism shown in Fig. 6 and also illustrates how the drum may be utilized to actuate control switches.
Figure 8:
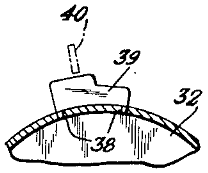
Fig. 8 is a sectional view along the line 8—8 of Fig. 7.

A modification of the invention in which the cam selector members are adjustable is illustrated in Figs. 6, 7 and 8. The motion of armature 11 is converted to a rotary motion of cylindrical hollow drum 32 through the action of rack 33 and pinion 34. Rack 33 is integral with armature 11 and has teeth 35 which mesh with teeth 36 of pinion 33, to convert, as is well known, translations of rack 34 to rotations of pinion 33. Pinion 33 rotates on shaft 37 to which hollow drum 32 is fastened. Any suitable material which is readily machined and has the necessary structural properties may be used to form all of these parts.

The surface of hollow drum 32 has a plurality of holes 38 which are adapted to receive cams 39. Cams 39 move followers 40 and thereby actuate the circuits which are to be controlled. As shown in Figs. 7 and 8, holes 38 of cylindrical drum 32 are formed along circles on the surface of drum 32; and cams 39 are readily removed from these holes. By moving a cam 39 along any given circle the time when the follower 40 actuated by that particular cam 39 will be moved in the relation to the period of the motion of armature 11 may be varied. Furthermore, the use of longer and shorter cams 39 in the holes 38 of a given circle will enable the time during which follower 40 is deflected to be adjusted. The result of this arrangement is to provide a mechanism which may be easily adjusted to meet a large variety of control situations.

Preferred embodiments of the invention have been shown and described. It is apparent that many changes, additions and modifications may be made without departing from the spirit and scope of the invention, as herein disclosed and hereinafter claimed.

Having disclosed the invention what is claimed as new is:

1. An electrical switch comprising an armature, said armature including a plurality of teeth displaced one from the other along the longitudinal opposite edges thereof, a slotted member including a slot therein and having said armature passing through said slot, the edges of said slot being of a width to cause said slot to engage alternate teeth on opposite sides of said armature, a supporting block, a bi-metallic strip having one extremity thereof secured to said block and the other extremity thereof secured to said slotted member, a restoring member having one extremity thereof secured to said block and the other extremity thereof secured to said slotted member, a heater proximate said bimetallic element, a first switch in electrical circuit with said bi-metallic element and secured to said block, said teeth on one side of said armature closing said first switch at predetermined positions thereof, an electromagnet, a second switch in series electrical circuit with said electromagnet, means secured to said armature for closing said second switch at a predetermined position of said armature, a third switch secured to said block and a cam secured to said armature, said cam opening and closing said third switch at predetermined positions of said armature.

2. An electrical switch as in claim 1, wherein said third switch comprises a plurality of switch members and said cam member includes a plurality of means for selectively opening and closing said switch members at predetermined positions of said armature.

3. An electrical switch as in claim 1, wherein said third switch comprises a plurality of switch members, each of said switch members including a finger and said cam member including a plurality of risers, said risers moving said fingers at predetermined positions of said armature to open and close selectively said switch members.

4. An electrical switch comprising an armature, said armature including a plurality of teeth displaced one from the other along the longitudinal opposite edges thereof, a slotted member including a slot therein and having said armature passing through said slot, the edges of said slot being spaced apart a width to cause said slot to engage alternate teeth on opposite sides of said armature, a supporting block, a bi-metallic strip having one extremity thereof secured to said block and the other extremity thereof secured to said slotted member, a heater proximate said bi-metallic element, a first switch in electrical circuit with said bi-metallic element and secured to said block, said teeth on one side of said armature closing said first switch at predetermined positions thereof, an electromagnet proximate said armature and adapted to attract said armature as an electric current is passed therethrough, a second switch in series electrical circuit with said electromagnet, means secured to said armature for closing said second switch at a predetermined position of said armature, a third switch secured to said block, a rack gear secured to said armature, a cylindrical drum including raised areas thereon and a pinion gear secured thereto, said pinion gear in mesh with said rack gear and said raised areas opening and closing said third switch as said armature is at predetermined positions.

5. An electrical switch as in claim 4, wherein said third switch comprises a plurality of switch members and said cylindrical drum includes a plurality of raised areas for opening and closing said switch members as said armature is at predetermined positions.

MILTON ZUCKERMAN.

References Cited in the file of this patent

UNITED STATES PATENTS

| Number | Name | Date |
|---|---|---|
| 585,915 | Johnston | July 6, 1897 |
| 744,178 | Dresser | Nov. 17, 1903 |
| 795,235 | Richards et al. | July 18, 1905 |
| 950,336 | Marsh | Feb. 22, 1910 |
| 1,102,318 | Callow | July 7, 1914 |
| 1,258,368 | Smith | Mar. 5, 1918 |
| 1,429,525 | Olden | Sept. 19, 1922 |
| 1,950,115 | Kuenzli et al. | Mar. 6, 1934 |
| 2,060,299 | Gensburg | Nov. 10, 1936 |
| 2,468,996 | Olson | May 3, 1949 |